(12) United States Patent
Rao et al.

(10) Patent No.: US 6,808,986 B2
(45) Date of Patent: Oct. 26, 2004

(54) METHOD OF FORMING NANOCRYSTALS IN A MEMORY DEVICE

(75) Inventors: Rajesh A. Rao, Austin, TX (US); Ramachandran Muralidhar, Austin, TX (US); Tushar P. Merchant, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/231,556

(22) Filed: Aug. 30, 2002

(65) Prior Publication Data

US 2004/0043583 A1 Mar. 4, 2004

(51) Int. Cl.$^7$ .............................................. H01L 21/336
(52) U.S. Cl. ..................... 438/257; 438/260; 438/503
(58) Field of Search ......................... 438/503, 257–267, 438/489, 509

(56) References Cited

U.S. PATENT DOCUMENTS

| | | |
|---|---|---|
| 5,830,538 A | 11/1998 | Gates et al. |
| 5,850,064 A | 12/1998 | Goldstein |
| 6,060,743 A | 5/2000 | Sugiyama et al. |
| 6,090,666 A | 7/2000 | Ueda et al. |
| 6,268,041 B1 | 7/2001 | Goldstein |
| 6,297,095 B1 | 10/2001 | Muralidhar et al. |
| 6,344,403 B1 | 2/2002 | Madhukar et al. |
| 6,455,372 B1 | 9/2002 | Weimer |

OTHER PUBLICATIONS

Fernandes et al, "Memory Characteristics of Si Quantum Dot Devices with SiO$_2$/ALD Al$_2$O$_3$ Tunneling Dielectrics," Electron Devices Meeting, 2001, IEDM TEchnical Digest. International, 2001, pp. 74.1–74.4.

Baron et al., "Growth by Low Pressure Chemical Vapor Deposition of Silicon Quantum Dots on Insulator for Nano-electronics Devices," Materials Research Society Sumposium Proc. vol. 571, 2000 Materials Research Society, pp. 37–42.

Madhukar et al., "CVD Growth of Si Nanocrystals on Dielectric Surfaces for Nanocrystal Floating Gate Memory Application," Materials Research Society Proc. vol. 638, 2001 Materials Research Society, pp. F5.2.1–F5.3.1.

Kamins, "Polycrystalline Silicon for Integrated Circuits and Displays," 2nd Edition, Kluwer Academic Publishers, 1998, Boston, p. 44.

(List continued on next page.)

*Primary Examiner*—Jack Chen
(74) *Attorney, Agent, or Firm*—Kim-Marie Vo; Robert L. King

(57) ABSTRACT

Nanocrystals (22) are formed in a semiconductor, such as for example, in a memory having a floating gate. A dielectric (18) overlies a substrate (12) and is placed in a chemical vapor deposition chamber (34). A first precursor gas, such as disilane (36), is flowed into the chemical vapor deposition chamber during a first phase to nucleate the nanocrystals (22) on the dielectric with first predetermined processing conditions existing within the chemical vapor deposition chamber for a first time period. A second precursor gas, such as silane, is flowed into the chemical vapor deposition chamber during a second phase subsequent to the first phase to grow the nanocrystals under second predetermined processing conditions existing within the chemical vapor deposition chamber for a second time period.

15 Claims, 1 Drawing Sheet-

OTHER PUBLICATIONS

Kawashima et al., "Monitoring of Silicon Nano–Crystal Formation on $SiO_2$ and on $Si_3N_4$ in an UHV–CVD System," Presented at the Materials Research Society 2001 Fall Meeting in the Symposium on Nanoparticulate Materials, Boston, MA, 7 pgs, without Abstract Section.

Hu et al., "Real Time Investigation of Nucleation and Growth of Silicon on Silicon Dioxide Using Silane and Disilane in a Rapid Thermal Processing System," J. Vac. Sci. Technol. B 14(2), Mar./Aug. 1996, pp. 744–750.

Leach et al., "Cracking Assisted Nucleation in Chemical Vapor Deposition on Silicon Dioxide," Journal of Crystal Growth, vol. 240, No. 3–4, pp. 415–422 (2002).

Masato Oishi et al, "Fabrication of Silicon Nano–Crystal Dots on $SiO_2$ by Ultrahigh–Vacuum Chemical Vapor Deposition," Materials Research Society, Symposium Procedures, vol. 638, 3 pgs. (2001).

F. Mazen et al., "Control of Silicon Quantum Dots Nucleation and Growth by CVC," Materials Research Society, Symposium Procedures, vol. 737, pp. F1.9.1–F1.9.6 (2003).

Quin et al., "Observation of Coulomb–Blockade in a Field–Effect Transistor With Silicon Nanocrystal Floating Gate at Room Temperature," Solid State Communications 111, 1999, pp. 171–174.

PCT/US03/16289 International Search Report.

METHOD OF FORMING NANOCRYSTALS IN A MEMORY DEVICE

FIELD OF THE INVENTION

The invention relates generally to the field of semiconductors and more specifically to memory devices.

BACKGROUND OF THE INVENTION

Electrically erasable programmable read only memory (EEPROM) structures are commonly used in integrated circuits for non-volatile date storage. EEPROM device structures commonly include a polysilicon floating gate formed over a tunnel dielectric, which is formed over a semiconductor substrate, to store charge. As device dimensions and power supply voltages decrease, the thickness of the tunnel dielectric cannot correspondingly decrease in order to prevent data retention failures. An EEPROM device using isolated silicon nanocrystals as a replacement to the floating gate does not have the same vulnerability to isolated defects in the tunnel dielectric and thus, permits scaling of the tunnel dielectric and the operating voltage without compromising data retention.

In order to have a significant memory effect as measured by the threshold voltage shift of the EEPROM device, it is necessary to have a high density of silicon nanocrystals of approximately 1E12 nanocrystals per $cm^2$. One method to achieve such a density of nanocrystals is to fabricate the nanocrystals using ultra high vacuum chemical vapor deposition (UHVCVD) using disilane ($Si_2H_6$). However, the length of the process time is greater than 10 minutes per wafer, which results in undesirable increased cycle time and manufacturing costs. Other approaches to form nanocrystals on the tunnel dielectric have resulted in achieving densities significantly less than desired (e.g., 5E11 nanocrystals per $cm^2$). Therefore, a need exists to form nanocrystals at desired densities without increasing manufacturing cycle time or cost.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A two-phase process is used to form nanoclusters, such as nanocrystals, over a dielectric layer in transistor that is used in one embodiment as a data storage device. The first phase, a nucleation phase, uses a first precursor that has a higher sticking coefficient to an underlying dielectric layer (e.g., a tunnel dielectric) than the second precursor used in the second phase, the growth phase. Furthermore, the second precursor has a greater sticking coefficient to the material used to form the nanocrystals than it does to the underlying dielectric layer. In a preferred embodiment, the first precursor is disilane (gas) and the second precursor is silane (gas). Furthermore, in the preferred embodiment, the same processing conditions (temperature, pressure and co-flow gases) are used in the first phase and the second phase. The nanocrystals being formed during the two-phase process are part of a memory device shown in FIG. 1, in one embodiment.

Figure 1:
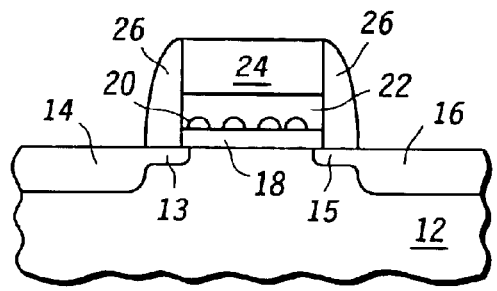
FIG. 1 illustrates a cross-sectional view of a memory device having nanocrystals formed in accordance with an embodiment of the present invention.

FIG. 1 illustrates a memory device 10 having a semiconductor substrate 12, a source extension 13, a deep source region 14, a drain extension 15, a deep drain region 16, a tunnel dielectric 18, nanocrystals 20, a control dielectric 22, a control electrode 24, and spacers 26. Since the formation of all the portions of the memory device 10, except for the formation of the nanocrystals 20, can be formed using conventional processes, the formation of the portions of the memory device 10 will be explained in brevity. The semiconductor substrate can be silicon, silicon germanium, gallium arsenide, silicon-on-insulator (SOI), the like, or combinations of the above. A dielectric layer, such as silicon dioxide, is formed over the semiconductor substrate, by thermal growth, chemical vapor deposition (CVD), the like, or combinations of the above to be used as the tunnel dielectric 18. The nanocrystals are formed over the dielectric layer, as will be explained in more detail in regards to FIG. 2, and in one embodiment are the floating gate of the memory device 10. Optionally, a passivation layer (not shown) containing nitrogen can be formed over the nanocrystals 20. A control dielectric 22, such as silicon dioxide, hafnium oxide, aluminum oxide, the like, and combinations of the above, is deposited over the nanocrystals 20. After forming the control dielectric 22, a conductive material, such as polysilicon, is deposited to form the control electrode 24. The control electrode 24, the control dielectric 22, the nanocrystals 20, and the tunnel dielectric 18 are etched in order to remove portions of the materials in areas of the semiconductor substrate 12 where the source extension 13, the deep source region 14, the drain extension 15 and the drain region 16 will be formed.

After etching the layers, the source extension 13 and the drain extension 15 are formed by shallow ion implantation. After forming the extensions 13 and 15, a dielectric layer, such as silicon nitride, is deposited over the semiconductor substrate and anisotropically etched to form spacers 26 adjacent the control electrode 24, the control dielectric 22, the nanocrystals 20 and the tunnel dielectric 18. The deep source region 14 and the deep drain region 16 are formed using the spacers 26 and the control electrode 24 as a mask during deep ion implantation. The resulting memory device 10 is especially useful as a non-volatile memory (NVM) device formed on a semiconductor substrate with (i.e., an embedded NVM device) or without (i.e., a stand-alone NVM device) logic transistors. Furthermore, the memory device 10 is a data storage device.

Figure 2:
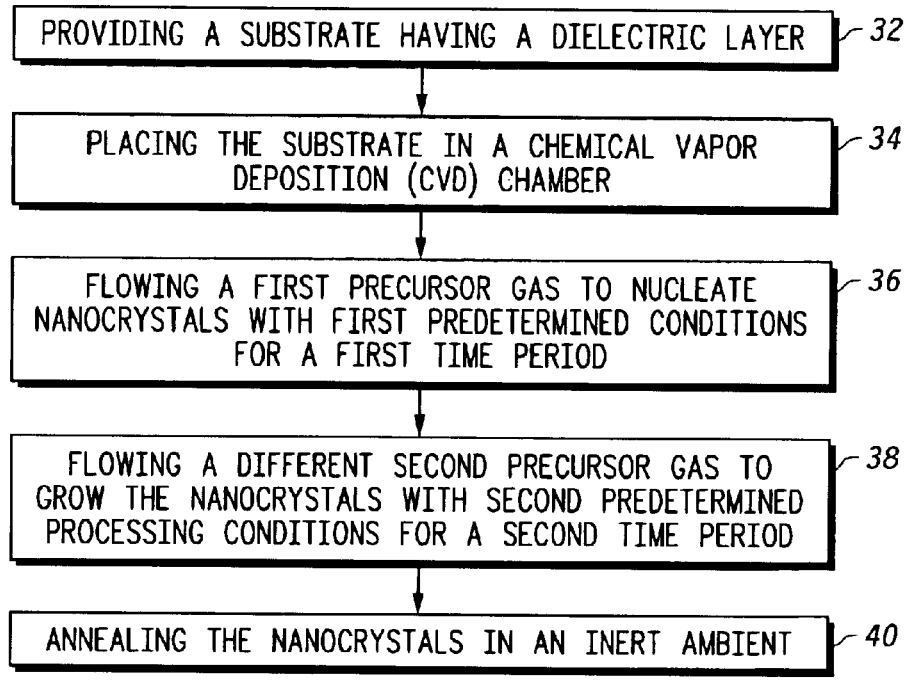
FIG. 2 illustrates a flow diagram for forming the nanocrystals of FIG. 1 in accordance with an embodiment of the present invention.

The nanocrystals 20 can be formed using a nanocrystal fabrication process 30, shown in FIG. 2, to achieve desired densities of approximately 1E12 nanocrystals per $cm^2$. After forming a dielectric layer (i.e., the tunnel dielectric 18 in FIG. 1) over the semiconductor substrate 12, the semiconductor substrate 12 having the dielectric layer is provided in step 32 of the nanocrystal fabrication process 30. The semiconductor substrate 12 is then placed in a chemical vapor deposition (CVD) chamber in step 34. Preferably, the CVD chamber is a cold-walled rapid thermal chemical vapor deposition (RTCVD) chamber, because it minimizes gas phase reaction and nucleation away from the semiconductor substrate 12, which are additional noise factors, and promotes beneficial gas phase reactions close to the semiconductor substrate 12 surface. However, the CVD chamber can be an ultra high vacuum chemical vapor deposition (UHVCVD), a low-pressure chemical vapor deposition (LPCVD), or the like, chamber.

After placing the semiconductor substrate 12 in the CVD chamber, a first precursor gas is flown to nucleate nanocrystals with first predetermined processing conditions existing within the chemical vapor deposition chamber for a first time period as shown as step 36, which is the first phase (i.e., the nucleation phase of nanocrystal formation), in FIG. 2. In a preferred embodiment, the nanocrystals 20 are silicon and thus a silicon-containing precursor is used. Both silane ($SiH_4$) and disilane ($Si_2H_6$) are suitable silicon-containing precursors. However, disilane has a higher sticking coefficient on silicon dioxide relative to that on silicon, which is preferably the material used for the tunnel dielectric layer 18. Silane has a lower sticking coefficient on silicon dioxide relative to that on silicon. Since for the first phase of nanocrystal formation, it is desirable to have many nucleation sites formed, the sticking coefficient of the precursors relative to the tunnel dielectric (e.g., silicon dioxide) and to the material being formed (e.g., silicon) determines the precursor used. Thus, disilane should be used over silane in the embodiment described where the tunnel dielectric includes silicon dioxide and the nanocrystals being formed includes silicon. Relative values of sticking coefficients on other material or for different precursors, can be obtained from the observed incubation time, defined as the time lag prior to nuclei formation.

When flowing the disilane, the silicon in disilane both attaches itself to silicon atoms already present on the tunnel dielectric 18 and to the tunnel dielectric 18, itself, creating new nucleation sites due to the sticking coefficients of disilane to silicon and silicon dioxide. In addition, disilane is preferred over silane because disilane dissociates at a lower temperature than silane, forming silylene that has a unit sticking coefficient to both silicon dioxide and silicon surfaces due to its unsaturated bonds. This allows for lower temperatures to be used. The first predetermined processing conditions include having the substrate temperature between approximately 400 to 600 degrees Celsius, or more specifically, 450 to 530 degrees Celsius and a partial pressure of disilane between approximately 10 to 200 mTorr or more preferably 10 to 100 mTorr. The temperature range of approximately 450 to 530 degrees is most desirable because at temperatures less than 450 degrees, hydrogen desorption from the surface is very slow, which blocks the disilane from reacting with the tunnel dielectric 18 to form nucleation sites, thus decreasing the nanocrystal density. Temperatures greater than 530 degrees Celsius are undesirable because silicon adatoms (i.e., the silicon atoms present on the surface of the tunnel dielectric 18) are removed due to silicon-oxide desorption. By forming nucleation sites at a low pressure and low temperature nucleation time is extended, thereby increasing the ability to control nucleation to prevent too many nucleation sites from forming and later aggregating into a continuous layer or very large nanocrystals.

In order to prevent a continuous layer from being formed and to attain fast cycle time during manufacturing, the time of the process should also be controlled. Preferably, the time is less than 50 seconds, or more preferably less than 25 seconds or most preferably, between 5 to 10 seconds. In another embodiment, the time is between approximately 30 seconds and 150 seconds. A co-flow gas of an inert gas, such as nitrogen, argon, and the like, can be flown while flowing the first precursor gas to aid in delivering the first precursor gas to the semiconductor substrate 12. It is undesirable to use hydrogen as the co-flow gas because once the disilane dissociates, the desorption of the surface reactant byproduct hydrogen is impeded by the hydrogen in the co-flow gas. It should be noted that the reason hydrogen is commonly used as a co-flow gas with silane in other CVD operations is that it helps to prevent gas phase decomposition of silane into silicon and hydrogen. However, the low partial pressure in combination with low temperature inhibits such gaseous phase decomposition. As such, other inert gases may be utilized as co-flow gases without concern for gaseous phase decomposition. Due to the presence of the co-flow gas and the first precursor gas in one embodiment, the total pressure during the first stage of the nanocrystal formation is approximately 18 Torr.

Figure 3:
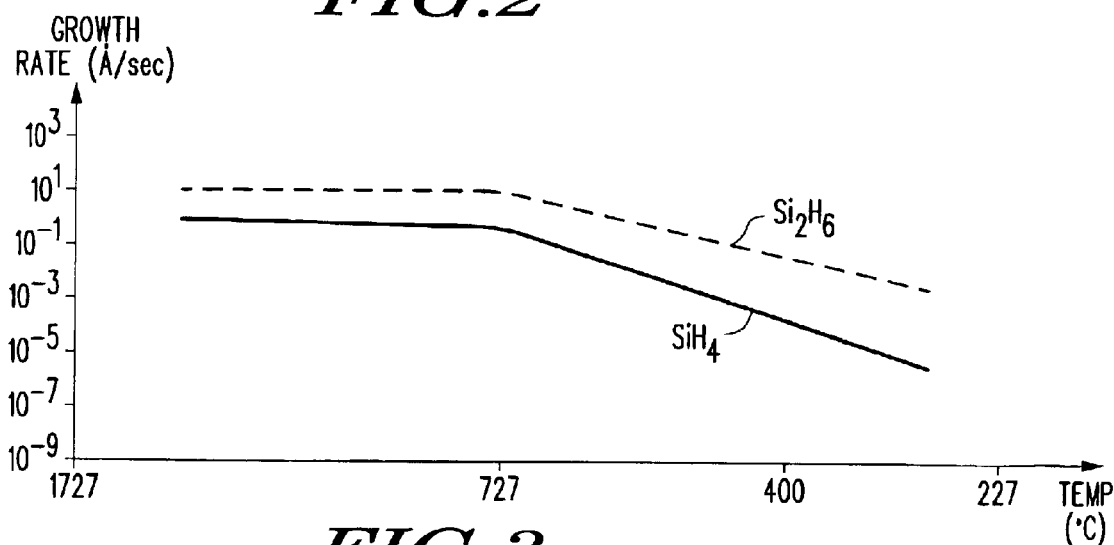
FIG. 3 illustrates a graph comparing the growth rates versus temperature for two silicon-containing precursors.

After forming nucleation sites in one embodiment, the flow of the first precursor in one embodiment is terminated or ended. After a time period, which in one embodiment is approximately 0–20 seconds, a second and different precursor gas is flown to grow the nanocrystals with a second predetermined processing conditions existing within the chemical vapor deposition chamber for a second time period, as shown in step 38, which is the second phase (i.e., growth phase) of the nanocrystal formation, of FIG. 3. In another embodiment, the second precursor is flown while flowing the first precursor. It is desirable to have a slow growth rate during the growth phase so that the growth process in controllable. As shown in FIG. 3 at a given temperature, the growth rate of silane is less than that of disilane, thus the second precursor is preferably silane. For example, in FIG. 3 at 450 degrees Celsius the growth rate of silane is approximately 1E-6 Angstroms per second, whereas the growth rate of disilane is approximately 1E-2 Angstroms per second.

The nucleation sites grow by the silicon in the silane attaching to the nucleation sites and by the diffusion of silicon along the surface of the semiconductor substrate 12. By decreasing the temperature during this growth stage, it takes longer for silicon to diffuse to a nucleation site during growth, thereby increasing the control of the growth stage.

It is undesirable for the second precursor to react with the tunnel dielectric layer 18 instead of the nucleation sites, which could lead to the size distribution of the nanocrystals varying too much. Therefore, the second precursor should have a lower sticking coefficient to the tunnel dielectric layer 18 (i.e., the exposed layer on which the nanocrystals are being formed) than it does to the nanocrystals themselves. Thus, for silicon nanocrystal formation and a silicon dioxide tunnel dielectric layer 18 silane is desirable because its sticking coefficient to silicon is approximately four orders of magnitude higher than on silicon dioxide. Since silane has a greater sticking coefficient to silicon than silicon dioxide, the silane will react with the existing nucleation sites to enlarge or grow the nucleation sites into nanocrystals instead of reacting with the silicon dioxide and forming addition nucleation sites. Disilane based on sticking coefficients alone would be desirable, but as already explained is undesirable due to its higher growth rate compared to silane. In addition, it is preferred to minimize the use of disilane since disilane is expensive.

The second predetermined processing conditions of the step 38 can be the same as or equal to the first processing conditions of step 36. It is desirable that the first and second predetermined processing conditions are the same, and all that is changed in the CVD chamber when converting from the step 38 to the step 36 is the precursor used (e.g., the first precursor is no longer flown and the second precursor is flown or the second precursor is added to the chamber with the first precursor). To change the temperature or pressure during processing, there is a time period associated with the temperature change and this may undesirably increase cycle time.

Alternatively, the second processing conditions of the step 38 can be different than the first processing conditions of the step 36. In one embodiment, the temperature of the semiconductor substrate 12 is approximately 500 to 580 degrees Celsius and the partial pressure of silane may be approximately 10–100 mTorr. A co-flow gas of an inert gas, such as nitrogen or argon, may be used.

The second time period of the step 38 may be the same as the first time period of the step 36, but the second time period may be longer than the first time period. The second time period may be at least twice as long as the first time period. In one embodiment, the second time period is approximately 30 to 40 seconds per wafer. In a preferred embodiment, the combined time of the step 38 and the step 36 is less than or equal to approximately 60 seconds per wafer to achieve efficient manufacturing cycle time.

After the nanocrystals 20 are grown (i.e., subsequent to flowing the different second precursor gas), the nanocrystals 20 may be annealed in an inert ambient, such as nitrogen, as shown as step 40 in FIG. 2 to obtain an equilibrium shape. The anneal temperature may be approximately 750 degrees Celsius. Any other parameters for the anneal process may be used.

A desirable size of nanocrystals for use in the memory device 10 may be between 3 and 7 nanometers, and in some embodiments a target diameter of 5 nanometers may be appropriate. The coverage, or area density of the nanocrystals on the dielectric layer 18 may be approximately 20%. The 20% area density is reasonable for semiconductor device manufacturing, as it provides a level of tolerance in the spacing between the nanocrystals included in the floating gate structures. Although higher area densities may be achieved, the proximity of the isolated storage elements in such higher area density embodiments may increase the probability of later charge transfer between nanocrystals, thus degrading the beneficial effects of their isolation.

By using the above process with different precursors for the nucleation stage and growth stage of nanocrystal formation allows for nanocrystal fabrication with increased cycle time and decreased manufacturing cost compared to other approaches. Furthermore, by using the two-phase process as described, both the nucleation and growth of the nanocrystals can be well controlled.

In the foregoing specification, the invention has been described with reference to specific embodiments. However, one of ordinary skill in the art appreciates that various modifications and changes can be made without departing from the scope of the present invention as set forth in the claims below. For example, other precursor that have the properties suitable for the nucleation and growth phases may be used. Additionally, the nanocrystals can be another material other than silicon, such as germanium, and may or may not be doped. Furthermore, the nanocrystals can be formed on a layer other than the tunnel dielectric or any dielectric layer. In this embodiment, the sticking coefficients of the precursors to the layer on which the nanocrystals are being formed and the material from which they are being formed are relevant. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming nanocrystals, comprising:
providing a substrate;
forming a dielectric overlying the substrate;
placing the substrate in a chemical vapor deposition chamber;
flowing a first precursor gas into the chemical vapor deposition chamber during a first phase to nucleate nanocrystals on the dielectric with first predetermined conditions existing within the chemical vapor deposition chamber for a first time period;
ending the flowing of the first precursor gas into the chemical vapor deposition chamber; and
flowing a different second precursor gas into the chemical vapor deposition chamber during a second phase to grow the nanocrystals under second predetermined conditions existing within the chemical vapor deposition chamber for a second time period.

2. The method of claim 1 further comprising:
anncaling the nanocrystals in an inert ambient subsequent to flowing the different second precursor gas.

3. The method of claim 1 wherein the first predetermined conditions comprise:
a substrate temperature substantially in a range of four hundred degrees Centigrade to five hundred thirty degrees Centigrade; and
a precursor partial pressure within the chemical vapor deposition chamber substantially in a range of ten milliTorr to one hundred milliTorr.

4. The method of claim 1 further comprising making the second predetermined conditions equal to the first predetermined conditions.

5. The method of claim 1 further comprising implementing the first precursor gas using disilane, implementing the second precursor gas using silane and implementing the dielectric using silicon dioxide.

6. The method of claim 1 further comprising performing the chemical vapor deposition as a rapid thermal chemical vapor deposition (RTCVD) within the chemical vapor deposition chamber.

7. The method of claim 1 further comprising co-flowing an inert gas into the chemical vapor deposition chamber with the first precursor gas and the second precursor gas.

8. The method of claim 1 further comprising implementing the second time period as a longer time period than the first time period.

9. The method of claim 1 further comprising implementing the first time period to be no longer in length than twenty-five seconds.

10. A method of forming nanocrystals, comprising:
providing a substrate;
forming a dielectric overlying the substrate;
placing the substrate in a chemical vapor deposition chamber;
flowing a first precursor gas into the chemical vapor deposition chamber during a first phase to nucleate nanocrystals on the dielectric with first predetermined processing conditions existing within the chemical vapor deposition chamber for a first time period;
flowing a second precursor gas into the chemical vapor deposition chamber during a second phase subsequent to the first phase to grow the nanocrystals under second predetermined processing conditions existing within the chemical vapor deposition chamber for a second tune period;
implementing the first precursor gas using disilane; implementing the second precursor gas using silane; and implementing the dielectric using silicon dioxide.

11. The method of claim 10 further comprising performing the chemical vapor deposition as a rapid thermal chemical vapor deposition (RTCVD) within the chemical vapor deposition chamber.

12. The method of claim 10 further comprising forming a transistor using the nanocrystals to form a floating gate electrode of the transistor, the transistor functioning as a data storage device in a semiconductor memory.

13. A method of forming nanocrystals, comprising:
providing a semiconductor substrate;
forming a dielectric layer overlying the semiconductor substrate;
placing the semiconductor substrate in a chemical vapor deposition chamber for implementing a rapid thermal chemical vapor deposition of material on the dielectric layer;
flowing for a first time period disilane gas into the chemical vapor deposition chamber during a first phase to form a plurality of nanocrystals on the dielectric layer with a temperature in a range of 400 degrees Centigrade to five hundred thirty degrees Centigrade and a disilane gas partial pressure in a range of ten to one hundred milliTorr existing within the chemical vapor deposition chamber; and
flowing for a second time period silane gas into the chemical vapor deposition chamber during a second phase subsequent to the first phase to grow the nanocrystals under processing conditions existing within the chemical vapor deposition chamber of at least as much temperature and partial pressure as during the first time period, the second time period being longer in length than the first time period.

14. The method of claim 13 further comprising:
flowing each of the disilane gas and the silane gas in combination with an inert gas to assist transporting the disilane gas and the silane gas to a surface of the layer of silicon dioxide.

15. A method of forming nanocrystals, comprising:
providing a substrate;
forming a dielectric overlying the substrate;
placing the substrate in a chemical vapor deposition chamber;
flowing a first precursor gas having a first sticking coefficient on a surface of the dielectric into the chemical vapor deposition chamber during first phase to nucleate nanocrystals on the dielectric with first predetermined processing conditions existing within the chemical vapor deposition chamber for a first time period; and
flowing a second precursor gas into the chemical vapor deposition chamber during a second phase to grow the nanocrystals under second predetermined processing conditions existing within the chemical vapor deposition chamber for a second time period, the second precursor gas having a second sticking coefficient on the surface of the dielectric that is less than the first sticking coefficient and having a third sticking coefficient on a surface of the nanocrystals that is higher than the second sticking coefficient.

UNITED STATES PATENT AND TRADEMARK OFFICE
CERTIFICATE OF CORRECTION

PATENT NO. : 6,808,986 B2
APPLICATION NO. : 10/231556
DATED : August 30, 2002
INVENTOR(S) : Rajesh A. Rao Page 1 of 1

It is certified that error appears in the above-identified patent and that said Letters Patent is hereby corrected as shown below:

In Column 6, Line 38, Claim No. 2:

Change "anncaling" to --annealing--

In Column 8, Line 26, Claim No. 15:

Between the words "during" and "first", Add the word --a--

Signed and Sealed this

Thirteenth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 6,808,986 B2
APPLICATION NO. : 10/231556
DATED : October 26, 2004
INVENTOR(S) : Rajesh A. Rao It is certified that error appears in the above-identified patent and that said Letters Patent is hereby corrected as shown below:

In Column 6, Line 38, Claim No. 2:

Change "anncaling" to --annealing--

In Column 8, Line 26, Claim No. 15:

Between the words "during" and "first", Add the word --a--

This certificate supersedes Certificate of Correction issued November 13, 2007.

Signed and Sealed this

Eighteenth Day of December, 2007

JON W. DUDAS
*Director of the United States Patent and Trademark Office*